United States Patent [19]

Chishiki

[11] Patent Number: 5,361,237
[45] Date of Patent: Nov. 1, 1994

[54] SEMICONDUCTOR MEMORY DEVICE PROVIDED WITH A WORD-LINE DRIVER CIRCUIT USING BOOSTED VOLTAGE-SOURCE DIVIDED DECODING

[75] Inventor: Shigeo Chishiki, Tokyo, Japan

[73] Assignee: NEC Corporation, Tokyo, Japan

[21] Appl. No.: 959,559

[22] Filed: Oct. 13, 1992

[30] Foreign Application Priority Data

Jan. 7, 1992 [JP] Japan .................................. 4-001015

[51] Int. Cl.$^5$ .............................................. G11C 8/00
[52] U.S. Cl. ........................... 365/230.06; 365/189.01; 365/189.09
[58] Field of Search ....................... 365/189.11, 230.03, 365/230.06, 189.01, 189.07, 189.09; 331/57

[56] References Cited

U.S. PATENT DOCUMENTS

| | | | |
|---|---|---|---|
| 4,873,673 | 10/1989 | Hori et al. ...................... | 365/230.06 |
| 5,148,401 | 9/1992 | Sekino et al. .................. | 365/230.03 |
| 5,185,721 | 2/1993 | Love et al. ..................... | 365/189.11 |
| 5,253,201 | 10/1993 | Atsumi et al. .................. | 365/189.07 |
| 5,255,224 | 10/1993 | Galbi et al. ..................... | 365/189.09 |

*Primary Examiner*—Eugene R. LaRoche
*Assistant Examiner*—F. Niranjan
*Attorney, Agent, or Firm*—Sughrue, Mion, Zinn, Macpeak & Seas

[57] ABSTRACT

A semiconductor memory device improves the power source margin without having an extended chip area. The semiconductor memory device of the present invention has a plurality of divided word lines, each having a plurality of drivers for supplying an electric current. The semiconductor memory device includes a boosting circuit for boosting and then supplying an external voltage to the plurality of drivers, and a voltage detection circuit for outputting detection signals which show the results of a comparison made between outputs of the boosting circuit and a reference voltage. The boosting circuit is structured so as to boost the external voltage according to the results of the comparison shown by the detection signals.

5 Claims, 7 Drawing Sheets

SEMICONDUCTOR MEMORY DEVICE PROVIDED WITH A WORD-LINE DRIVER CIRCUIT USING BOOSTED VOLTAGE-SOURCE DIVIDED DECODING

BACKGROUND OF THE INVENTION

1. Field of the Invention

The present invention relates to a semiconductor memory device, and in particular to a semiconductor memory device having a word driver circuit based on a divided decoding system.

2. Description of the Related Art

Semiconductor memory devices have become highly integrated as fine processing technology has improved. In particular, the dynamic random-access memory (hereinafter referred to as DRAM) of a simple memory cell structure has become highly integrated. As a result, 16 Mbit DRAMs sample have begun to be distributed to users, and papers, on 64 Mbit DRAMs are even being read in advanced groups such as academic societies.

In 16 Mbit DRAMs, the internal voltage is decreased to protect against deterioration of transistor characteristics and insufficient dielectric strength of gate oxide films and capacity oxide films, which may be caused by hot carriers. Further, in 64 MDRAMs, many products have been announced which are driven by a decreased source voltage of 3.3 V instead of the conventional 5 V in order to meet the above problems and to conserve power.

Semiconductor memory devices of a divided decoding system are proposed to reduce wiring space with a plurality of divided word lines and with drivers provided for each word line for supplying an electric current thereto.

Figure 1:
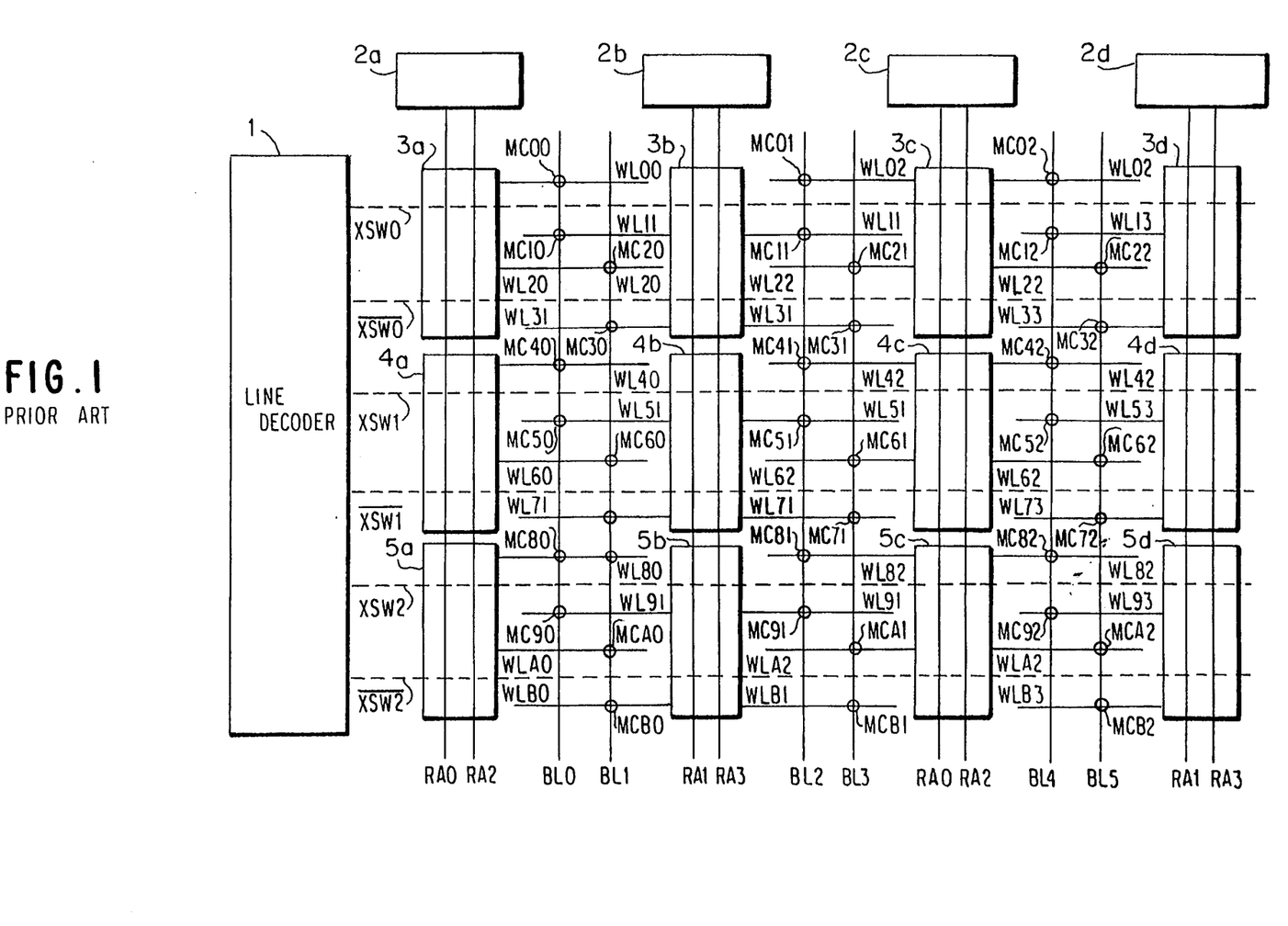
FIG. 1 is a circuit diagram showing the structure of the principal part of a semiconductor memory device according to a conventional divided decoding system.
Figure 2:
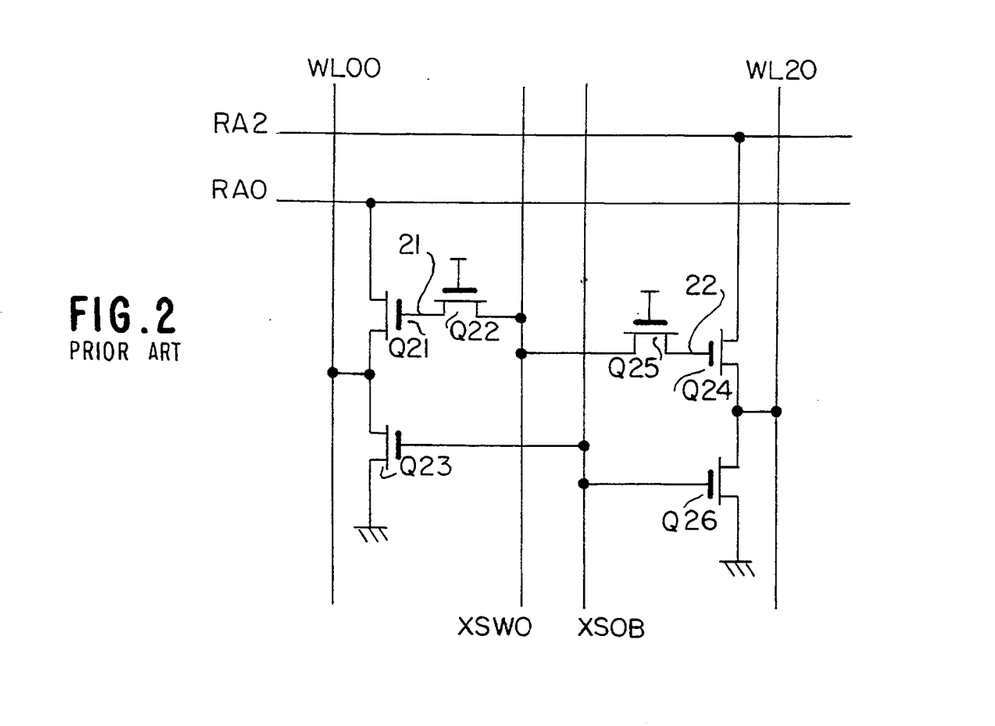
FIG. 2 is a circuit diagram of the word-line-drive-circuit represented by numeral 3a in FIG. 1.

FIG. 1 is a circuit diagram showing the structure of the principal part of a semiconductor memory device of a divided decoding system, while FIG. 2 is a circuit diagram of the word-line-drive-circuit represented by numeral 3a in FIG. 1.

The memory cell array constructed of memory cells MC00 to MCB2 is divided into a plurality of blocks in the direction separating word lines, word-line-drive-circuits 3a to 3d, 4a to 4d, 5a to 5d are disposed on both sides of all blocks, and each word line is connected alternately to word-line-drive-circuits 3a to 3d, 4a to 4d, and 5a to 5d.

Memory cells MC00 to MCB2 are disposed at each of the intersecting points of word lines WL00 to WLB3 and bit lines BL0 to BL5.

Complementary signals XSW0 to XSW2 and $\overline{XSW0}$ to $\overline{XSW2}$ are output from line decoder 1 to word-line-drive-circuits 3a to 3d, 4a to 4d, 5a to 5d in order to select the word-line-drive-circuit.

Lines for word-line-drive-current-supply-signals RA0 to RA3 are transmitted on word-line-drive-circuits in the direction perpendicular to the word lines. Signals RA0, RA2 are inputted to word-line-drive-circuits 3a, 4a, 5a, 3c, 4c, 5c, and signals RA1, RA3 to word-line-drive-circuits 3b, 4b, 5b, 3d, 4d, 5d alternately, respectively.

Word-line-drive-circuits 3a to 3d, 4a to 4d, and 5a to 5d are composed of two drive circuits of the self-boost type, as shown in FIG. 2 which is used to only transistor's capacities for boosting without installing external capacities.

For example, if complementary signal XSW0 and word-line-drive-current-supply-signal RA0 are selected, N type transistors Q23, Q26 are turned off by signals XSW0 and $\overline{XSW0}$, and after the potential of nodes 21, 22 are increased from the ground potential to the potential to be obtained by decreasing the threshold voltages of N type transistors Q22, Q25, respectively, from the source potential, the potential of node 21 is further increased, due to the self-boost of the transistor generated in RA0, to a potential higher than that of RA0 whose potential has been boosted in advance by means of a boost circuit not shown. The potential of word line WL00 is also increased to the same potential as that of RA0. Not only in circuit 3a, but also in circuit 3c, the potential of line WL02 is increased in the same way, and memory cells MC00, MC01, MC02 are selected.

Figure 3:
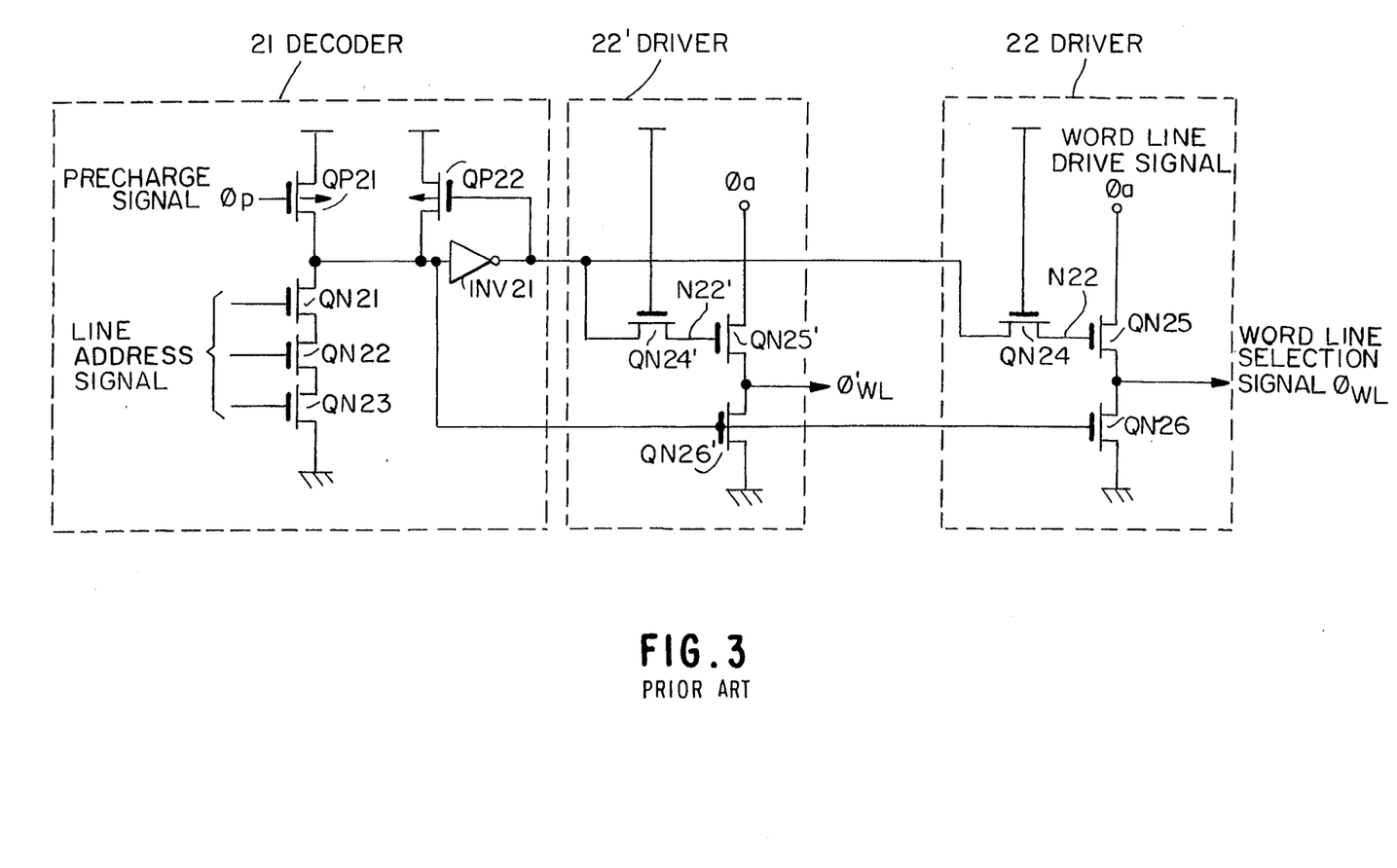
FIG. 3 is a circuit diagram showing a detailed structure of the principal part of a word-driver-circuit which supplies an electric current to word lines in the circuits shown in FIG. 1.

FIG. 3 is a circuit diagram showing the detailed structure of the principal part of the word-driver-circuit which supplies an electric current to a word line in the circuit shown in FIG. 1.

The present example of the conventional type is composed of decoder 21 which is selected by line address signals and a plurality of drivers which drive word lines, and drivers 22, 22' are shown in the figure. This conventional type structure is provided for each word line in the memory cell, but is shown here for only particular word line WL for simplification.

Decoder 21 comprises P type transistors QP21, QP22, N type transistors QN21, QN22, Q23, and inverter INV21, in which the sources of transistors QP21, QP22 are connected to the power source supply line and the drains thereof are connected to node 21. To the gate of transistor QP21, precharge signal $\phi p$ is input, and to a gate of transistor Q22, the output of inverter INV21 is input. To each gate of transistors QN21, QN22, QN23, a line address signal is inputted, while node 21 is grounded through each transistor QN21, QN22 and QN23 in succession.

Driver 22 (22') is composed of N type transistors QN24, QN25, QN26 (QN24', QN25', QN26'), in which the gate of transistor QN24 (24') is connected to the power supply line, the source thereof is connected to the output terminal of inverter INV21, and the drain thereof (node N22, N22') is connected to the gate of transistor QN25 (QN25'). To the source of transistor QN25 (25'), word-line-drive-signal $\phi_a$ is inputted, and a drain which is connected to word line is grounded via transistor QN26 (QN26'), whose gate is connected to node 21.

Next, the operation of the present example of the conventional type will be described.

When resetting, the ground voltage is applied to precharge signal $\phi_p$, and node N21 is charged to the source voltage VCC through transistor QP21. When selecting a memory cell, precharge signal $\phi_p$ transits to the source voltage, and each line address signal to be inputted to each gate of transistors QN21, QN22, QN23 is activated to select the decoder.

In the case that decoder 21 is selected by line address signals, each of transistors QN21, QN22, QN23 is turned on to make node N21 have the ground voltage, and node N22 (N22') is charged to the potential of (VCC−VT) by the output of inverter INV21, where VT is the threshold voltage of transistor QN24 (QN24'). Then activated word-line-drive-signal $\phi_a$ causes the voltage of node N22 (N22') to increase higher than that of the VCC by self-boosting of transistor QN25 (QN25'), thereby activating word-line-selection-signal φWL (φ'WL) to select the memory cell. In this way, word line WL is activated by an electric current supplied from the source by receiving word-line-selection-signals φWL, φ'WL which are output respectively from a plurality of drivers 22, 22' to word line WL.

Voltage VN2 (VN2') of node N22 (N22') is given in the following equation, where CG is the gate capacity of transistor QN25 (QN25')and CL is the load capacity of node N22 (N22'):

$$VN2\ (VN2') = \{(CG \times V\phi_a)/(CG+CL)\} + (VCC-VT) \quad (1)$$

Since transistor QN25 (QN25') is "on" when VN2 (VN2')−Vφ$_2$>VT, thus VCC becomes as follows.

$$VCC > 2VT + \{1-[CG/(CG+CL)]\}V\phi_2 \quad (2)$$

Therefore, if it is assumed that the capacity ratio of CG:CL=5:1, Vφ$_a$=4 V, VT=0.8 V, a source voltage VCC of 2.3 V or more is required to turn transistor QN25 (QN25') "on".

In the semiconductor memory device having a word-driver-circuit according to the above conventional divided decoding system, a plurality of word-line-selection-signals φWL (φ'WL) selected by decoder 21 are driven by driver 22 (22') provided separately for each word line, and hence transistor QN25 (QN25') which serves as the driving transistor of each driver 22 (22') is required to be made small with a small capacity CG gate. Consequently, when the source voltage is low, the voltage of node N22 (N22') cannot be raised sufficiently and transistor QN25 (QN25') is caused to operate in the saturation region resulting in a slow rise of the word lines.

Figure 4:
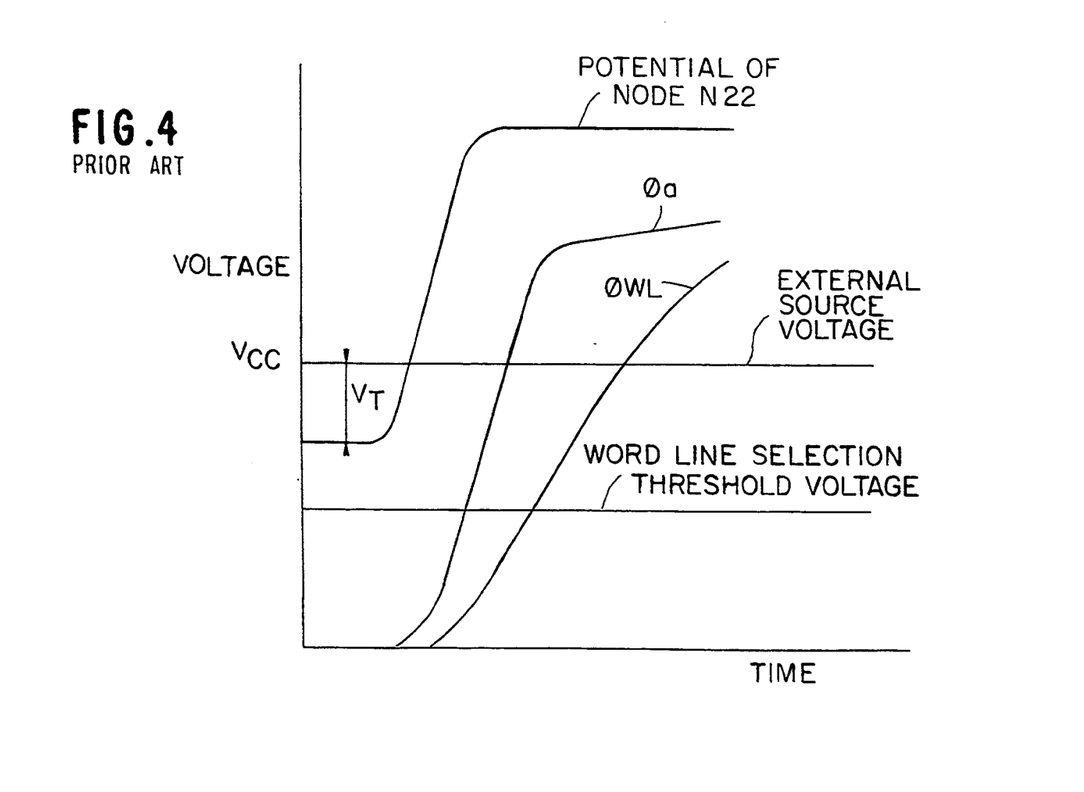
FIG. 4 is a graph showing the relation among the voltages of node N22, word-line-drive-signal φ$_a$ and word-line-selection-signal φWL in FIG. 3.

FIG. 4 is a graph showing the relation among the voltages of node N22, word-line-drive-signal φ$_a$ and word-line-selection-signal φWL in FIG. 3.

Since the voltage of word-line-selection-signal φWL varies upward and downward corresponding to variations in the voltage of node N22, in the case of a voltage drop of node N22, word-line-selection-signal φWL takes longer to reach the word-line- selection-threshold-voltage which recognizes selection of the word line.

Further, since word lines cannot be activated when the source voltage drops, it is necessary to provide a source voltage high enough to cover the drop which makes the source margin of the system inefficient. When the voltage of node N 22 (N22') is increased by increasing gate capacity CG of transistor QN25 (QN25') for the purpose of avoiding this drawback, transistor QN25 (QN25') becomes large resulting in a remarkably increased chip area of the semiconductor memory device.

SUMMARY OF THE INVENTION

The present invention is presented in view of the above drawbacks of the prior art. An object of the present invention is to provide a semiconductor memory device which can improve the power source margin without having a large chip area. The semiconductor memory device of the present invention having a plurality of divided word lines and a plurality of drivers provided in each divided word line for supplying an electric current, comprises, boosting means for boosting and then supplying an external voltage to said plurality of drivers; and a voltage detection circuit for outputting detection signals which show results obtained by comparing an output of said boosting means and a reference voltage; wherein, said boosting means boosts the external voltage according to the results of comparison shown by the detection signal.

In this case, it is acceptable to provide a reference-voltage-generation-circuit for generating the reference voltage to be compared in the voltage-detection-circuit, and it is also acceptable to provide a reference-voltage-input-terminal to use the voltage inputted into said terminal as the reference voltage.

In the semiconductor memory device of the present invention as constructed above, a low voltage is required as the external voltage because the external voltage is supplied to the drivers after it is boosted by the boosting means. Since the voltage is boosted by the boosting means according to the result of a comparison between the output of the boosting means and the reference voltage in the voltage-detection-circuit, it becomes easy to keep the output of the boosting means higher than a predesignated value by setting the reference voltage to an appropriate value. Thus the source margin is improved.

The above and other objects, features, and advantages of the present invention will become apparent from the following description referring to the accompanying drawings which illustrate an example of preferred embodiment of the present invention.

BRIEF DESCRIPTION TO THE DRAWINGS

FIG. 10 (a) is a diagram showing the input/output relation of reference-voltage-generation-circuit 601 for generating reference voltage VRef shown in FIGS. 6 and 7, FIG. 10 (b) is a graph showing a characteristic of its output voltage.

DETAILED DESCRIPTION OF THE PREFERRED EMBODIMENT

An embodiment of the present invention will be described with reference to the drawings.

Figures 5, 6:
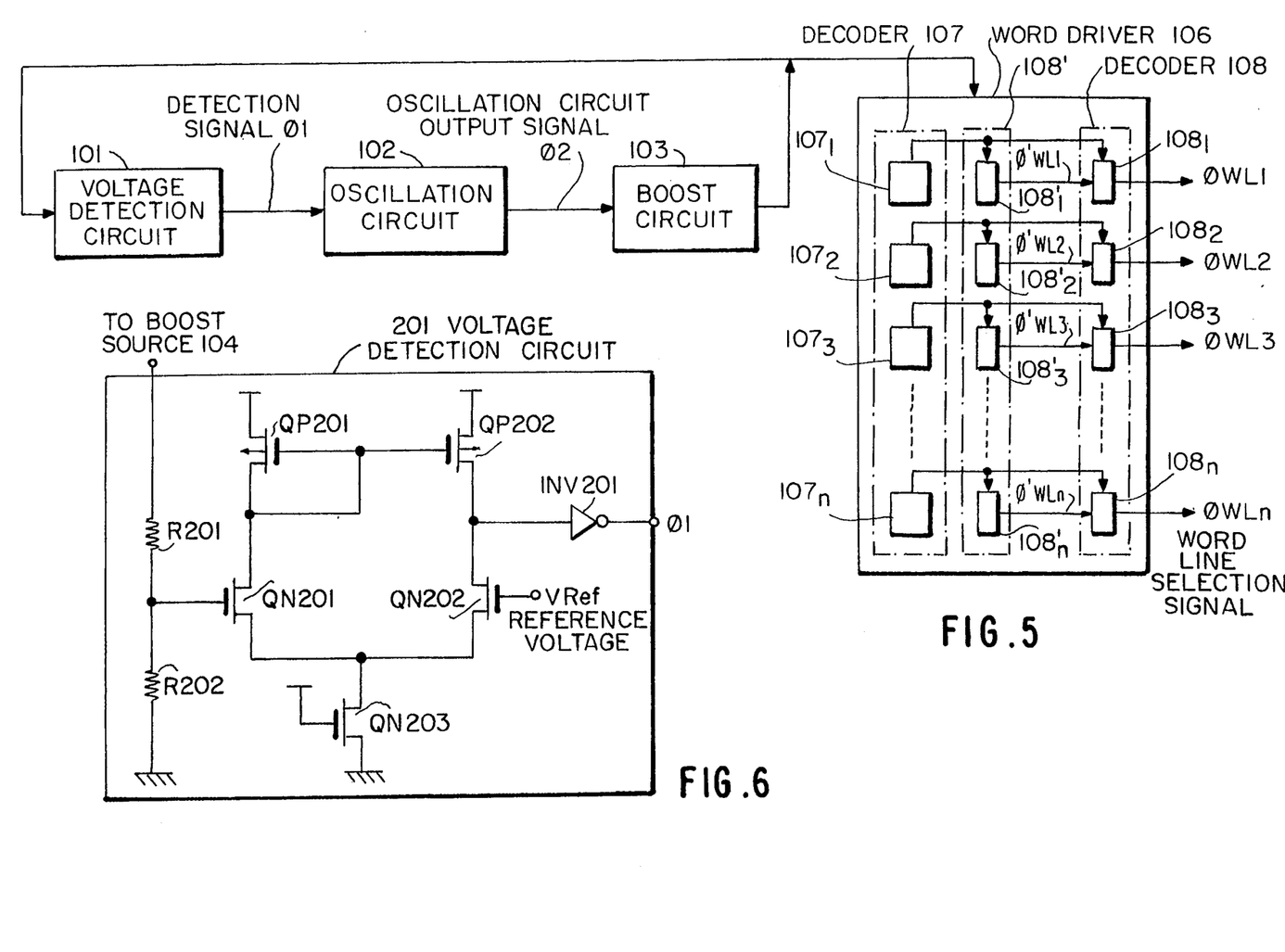
FIG. 5 is a block diagram showing the structure of the principal part of the present invention.
FIG. 6 is a circuit diagram showing the structure of an example of voltage-detection-circuit 101 in FIG. 5.

FIG. 5 is a block diagram showing the principal part of an embodiment of the present invention.

The present embodiment comprises voltage-detection-circuit 101, oscillation circuit 102, boost circuit 103 boosting the source voltage as needed and constructing boost means together with oscillation circuit 102, and word driver 106 of a divided decoding system constructing boost means together with boost circuit 103 and operating according to the output of boost circuit 103.

Word driver 106 for selecting a word line comprises decoder 107 consisting of a plurality of decoders $107_1$ to $107_n$ and drivers 108 and 108' consisting of a plurality of drivers $108_1$ to $108_n$ and $108'_1$ to $108'_n$ respectively, each decoder and each driver being provided respectively for each word line.

Voltage-detection-circuit 101 is provided for monitoring the outputs of boost circuit 103 used for activating word driver 106, and outputs detection signal $\phi_1$ to oscillation circuit 102 showing detection of the output voltage of boost circuit 103 when it is higher than the reference voltage. Oscillation circuit 102 is provided for varying the condition of oscillation-circuit-output-signal $\phi_2$ according to the condition of detection signal $\phi_1$, and keeps oscillation-circuit-output-signal $\phi_2$ at the stationary state if detection signal $\phi_1$ shows that to the output voltages of boost circuit 103 are higher than the reference voltage, and keeps oscillation circuit output signal $\phi_2$ at the oscillation state in other cases. Since boost circuit 103 adds to the source voltage by integrating oscillation circuit output signal $\phi_2$, the source voltage is stepped up when oscillation circuit output signal $\phi_2$ is at the oscillation state.

Figure 7:
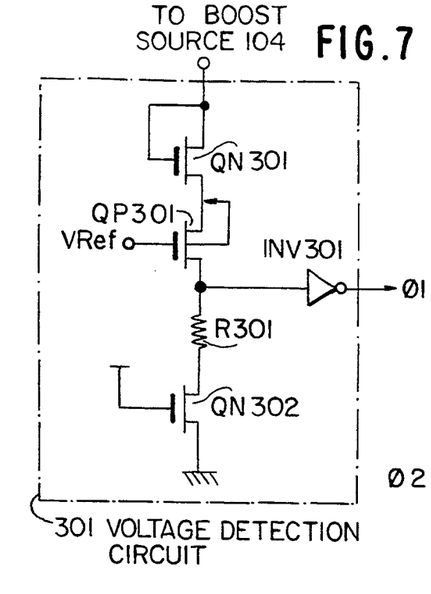
FIG. 7 is a circuit diagram showing the structure of another example of voltage-detection-circuit 101 in FIG. 5.

FIGS. 6 and 7 are circuit diagrams each showing examples of voltage-detection-circuit 101.

Voltage-detection-circuit 201 in FIG. 6 is comprises a differential amplifier consisting of P type transistors QP201, QP202, and N type transistors QN201, QN202, QN203.

P type transistors QP201, QP202 are each connected to the power source by their sources, and are commonly connected to the drain of transistor QP201 by the source of transistor QN201 by their gates. The drains of transistors QN201, 202 are commonly grounded via transistor QN203 which is always saturated, and the source of transistor QN202 and the drain of transistor QP202 are commonly connected to the input terminal of inverter INV201 which outputs detection signal $\phi_1$.

The output of boost power source 104 is supplied to the gate of transistor QN201 being divided in proportion to each value of resistances R201, R202, and compared with reference voltage VRef supplied to the gate of transistor QN202. Detection signal $\phi_1$ becomes a low level when divided output voltages of boost source 104 become higher than reference voltage VRef.

In voltage-detection-circuit 301 shown in FIG. 7, a comparison circuit consisting of N type transistors QN301, QN302 and P type transistor QP301 is used.

The output of boost circuit 104 is supplied to the source and the gate of transistor QN301. The drain of transistor QN301 is connected to the source of transistor QP301, to the gate of which reference voltage VRef is inputted. The drain of transistor QP301 is grounded through resistance R301 and transistor QN302 which is always saturated, and connected to the input terminal of inverter INV301 which outputs detection signal $\phi_1$.

In the present embodiment, when the output voltage of boost source 104 exceeds the sum of reference voltage VRef and two threshold voltages 2 VT of transistors QN301, QP301, transistor QP301 turns on and detection signal $\phi_1$ becomes a low level.

As described above, the voltage-detection-circuit can be constructed in various types and not limited to a particular structure.

Figure 8:
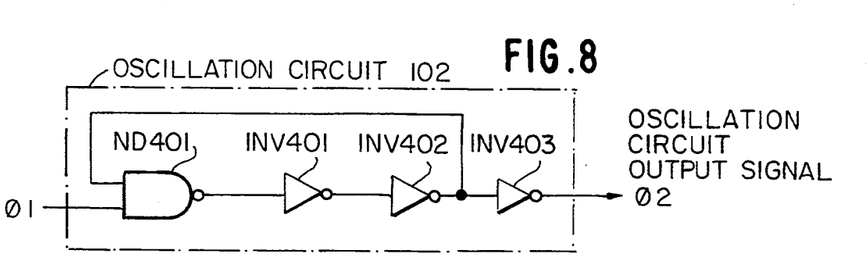
FIG. 8 is a circuit diagram showing the structure of oscillation circuit 102 in FIG. 5.

FIG. 8 is a circuit diagram showing the structure of oscillation circuit 102 in FIG. 5.

Oscillation circuit 102 comprises NAND gate ND401 and three inverters INV401 to INV403 provided in series. Nand gate ND401 has two input terminals, to one of which above detection signal $\phi_1$ is inputted and to the other of which the output of inverter INV402 is inputted. Accordingly, oscillation-circuit-output-signal $\phi_2$ which is output from inverter INV403 becomes the oscillating state when detection signal $\phi_1$ is at high level, and is kept in a low level when detection signal $\phi_1$ is in a low level.

Figure 9:
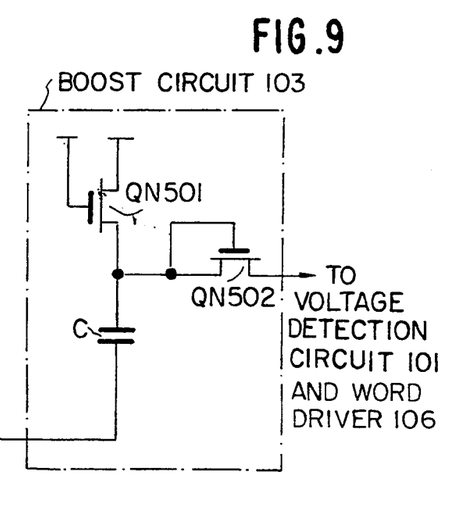
FIG. 9 is a circuit diagram showing the structure of boost circuit 103 shown in FIG. 5.

FIG. 9 is a circuit diagram showing the structure of boost circuit 103 in FIG. 5.

Boost circuit 103 is composed of N type transistors QN501, QN502 and capacitor C.

The gate and the source of transistor QN501 are connected to the power source, and its drain is connected to the gate and the source of transistor QN502. Since oscillation-circuit-output-signal $\phi_2$ is supplied to the drain of transistor QN501 (the gate and the source of transistor QN502) through capacitor C, the sum of voltages obtained by integrating oscillation-circuit-output-signal $\phi_2$ and source voltage VCC appears on the drain of transistor QN502 when oscillation-circuit-output-signals $\phi_2$ is at the oscillation state.

Figure 10A:
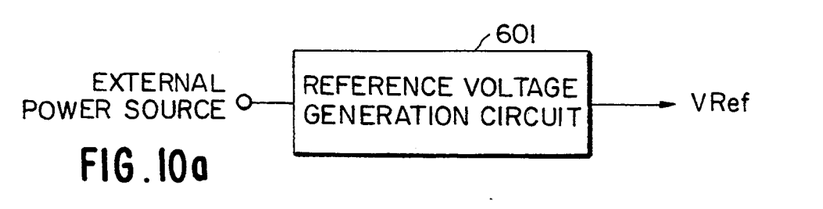
Figure 10B:
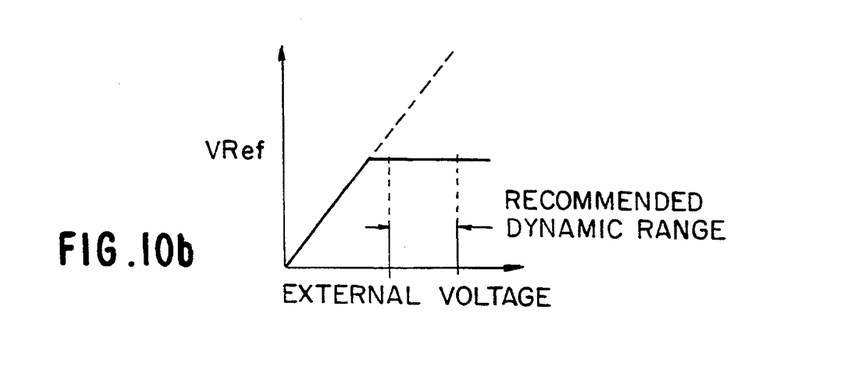

FIG. 10 (a) is a block diagram showing the input/output relation of reference-voltage-generation-circuit 601 which generates reference voltage VRef shown in FIGS. 6 and 7, while FIG. 10 (b) a graph showing a characteristic of the output voltage thereof.

Although reference-voltage-generation-circuit 601 outputs reference voltage VRef corresponding to the external voltage which is inputted from the external source to the circuit, VRef in the present embodiment is used in the recommended dynamic range with the constant-voltage characteristic shown in FIG. 10 (b).

Figure 11:
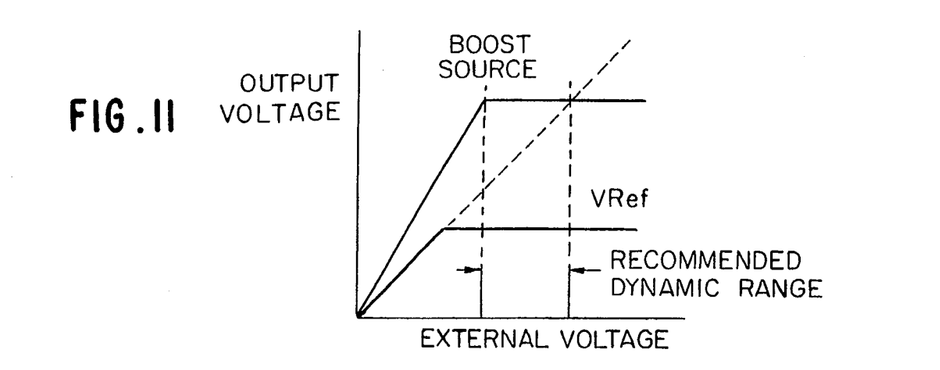
FIG. 11 is a graph showing characteristics of the output of boost circuit 103 in FIG. 5 and the output of reference voltage VRef.

FIG. 11 is a graph showing characteristics of the output voltages of reference voltage VRef and a boost source which is output from boost circuit 103.

The above graph shows that the output voltage of the boost source is also stable at a constant level in the recommended dynamic range of reference-voltage-generation-circuit 601.

Figure 12:
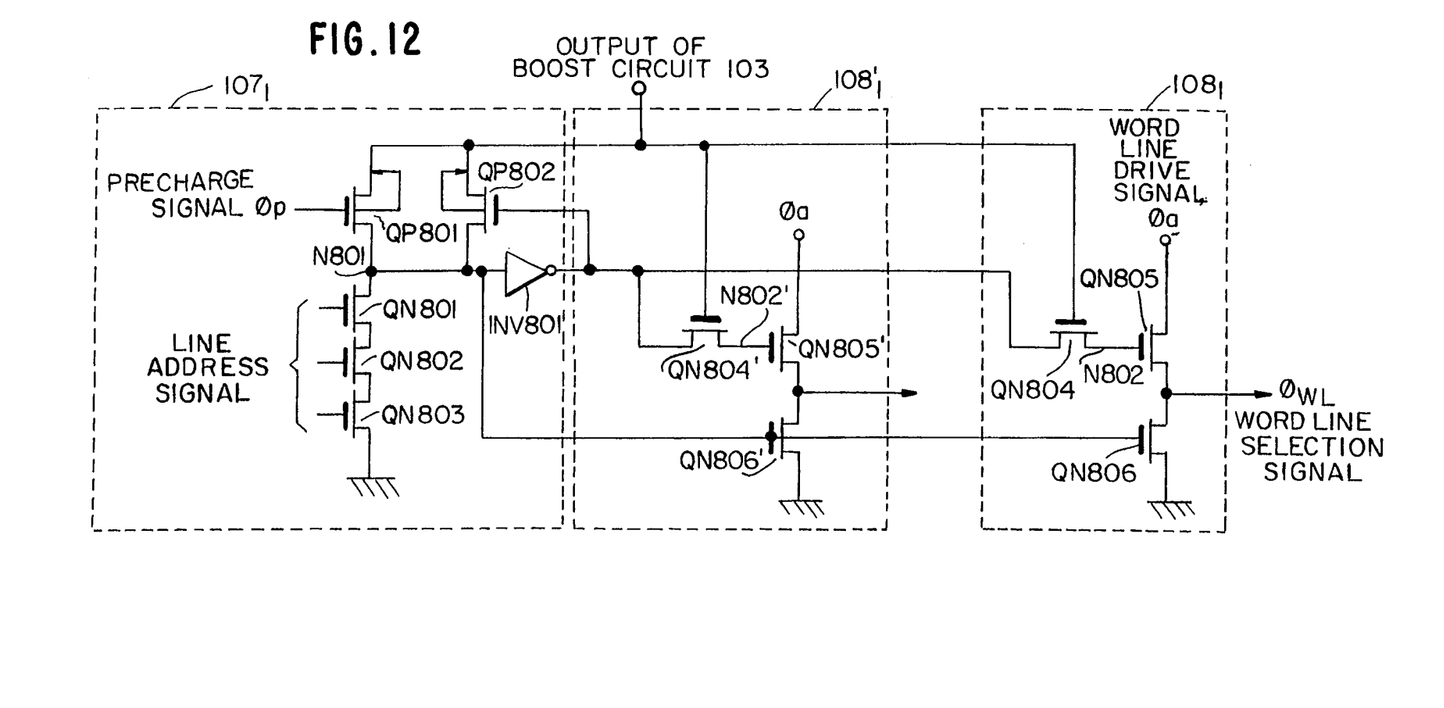
FIG. 12 is a circuit diagram showing the structures of decoder 107$_1$, driver 108$_1$, 108'$_1$ shown in FIG. 5.

FIG. 12 is a circuit diagram showing the structure of decoder $107_1$, and drivers $108_1$, $108'_1$ shown in FIG. 5, in which the structures and operations of other decoders $107_2$ to $107_n$ and the structures of drivers $108_2$ to $108_n$ ($108'_2$ to $108'_n$) are the same as those of decoder $107_1$ and drivers $108_1$, $108'_1$.

The output of boost circuit 103 is used as a power source and precharge signal $\phi_p$ to be supplied to P type transistors QP801, QP802, N type transistors QN801, QN802, QN803, inverter INV801 which constructs decoder $107_1$, and N type transistors QN804, QN805 (QN804', QN805') which construct drivers $108_1$ ($108'_1$). The other structures and operations of the above decoders and drivers are the same as those of transistors QP21, QP22, N type transistors QN21, QN22, QN23, inverter INV21 which construct conventional decoder 21 shown in FIG. 3, and N type transistors QN24, QN25, QN26 (QN24', QN25', QN26') which construct driver 22 (22'), so that descriptions with reference to other structures and operations of the above decoders and drivers are omitted.

In the present embodiment as structured above, output VBOOST of boost circuit 103 is given by VBOOST=αVCC, where α(α>1) is the boost ratio of the source voltage in boost circuit 103. Then, the voltage required is given by $$VCC > (1/\alpha) \cdot \{2VT + [1 - (CG/(CG+CL))] \, V\phi_a]\}$$

Thus, for example, if boost ratio α is set to 1.5, the required external source voltage can be reduced to ⅔ of the voltage required.

Figure 13:
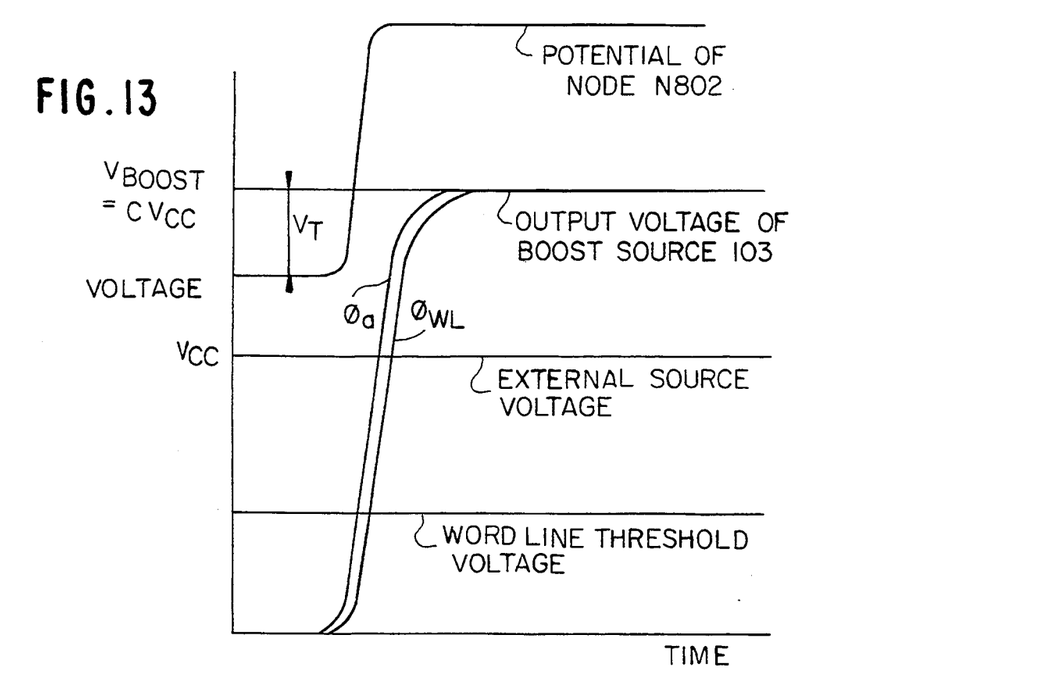
FIG. 13 is a graph showing the operation of each part of word driver 106 in FIG. 5.

FIG. 13 is a graph showing the operation of each part of word driver 106 of the present embodiment. Since the potential of node N802 in FIG. 12 (which corresponds to node N22 in FIG. 3 of the conventional example) becomes high, the self-boost efficiency of drive transistor QN805 is increased to operate linearly. Consequently, the power supply capacity of the driver is increased and the time required for word-line-selection-signal φWL to reach the word-line-selection-threshold-voltage is reduced.

Figure 14:
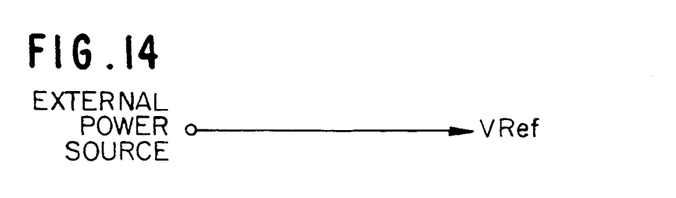
FIG. 14 is a diagram showing the structure of the principal part of the second embodiment of the present invention.

FIG. 14 is a diagram showing the principal part of a second embodiment of the present invention.

Unlike the first embodiment, in which reference-voltage-generation-circuit 601 is provided inside as shown in FIG. 10 for generating reference voltage VRef which is used in voltage-detection-circuit 103, a reference voltage input terminal is provided in the second embodiment for inputting the output of the external power source for use as reference voltage VRef.

Figure 15:
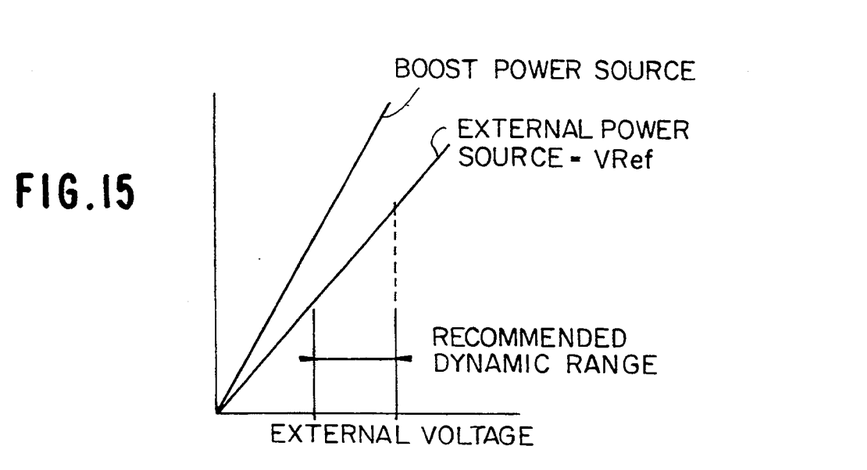
FIG. 15 is a graph showing characteristics of the output of boost circuit 103 and the output of reference voltage VRef in the second embodiment of the present invention.

Since the output of boost circuit 103 is increased as shown in FIG. 15 in proportion to the increased output of the external voltage which serves as reference voltage VRef in the second embodiment, it becomes easy to adjust the source margin. Thus the present invention can be constructed without providing any reference-voltage-generation-circuit.

In each embodiment described above, a word-driver-circuit composed of a decoder and two drivers is used, however, word-driver-circuits consisting of a decoder and three or more drivers can also be used in the present invention without reducing its effectiveness.

Since the present invention is constructed as described above, it has the advantages described below.

First, since boost means is provided for supplying to the drivers the external voltage boosted according to the voltage to be supplied to them, a drop in the voltage to be supplied to the drivers and a decrease in the rise of word lines can be prevented. The source margin can also be improved without increasing the chip area.

Second, since a reference-voltage-generation-means whose output is to be compared with the output of the boost means is provided, periphery circuits for the semiconductor memory device can be simply constructed.

Third, since a reference voltage is supplied from outside, the source margin can be easily controlled by changing the reference voltage optionally according to the use of the semiconductor memory device.

Although the variations of the embodiment described above are possible, the scope of the present invention is defined in the appended claims.

What is claimed is:

1. A semiconductor memory device having a plurality of divided word lines, and a plurality of decoders and a plurality of drivers provided in each of said divided word lines for supplying an electric current, comprising:
   boosting means for boosting and then supplying an external voltage to said plurality of decoders and to said plurality of drivers; and
   a voltage detection circuit for outputting detection signals which show the results of a comparison made between outputs of said boosting means and a reference voltage; wherein,
   said boosting means boosts said external voltage according to said results of said comparison shown by said detection signals.

2. A semiconductor memory device according to claim 1, comprising a reference-voltage-generation-circuit for generating said reference voltage to be used for said comparison in said voltage-detection-circuit.

3. A semiconductor memory device according to claim 1, comprising a reference-voltage-input-terminal for receiving an input which is used as said reference voltage.

4. A semiconductor memory device according to claim 1, wherein said boosting means is comprised of a plurality of transistors, each of said plurality of transistors being an N-channel transistor.

5. A semiconductor memory device according to claim 1, wherein each of said plurality of drivers is comprised of a plurality of transistors, each of said plurality of transistors being an N-channel transistor.

* * * * *

UNITED STATES PATENT AND TRADEMARK OFFICE
CERTIFICATE OF CORRECTION

PATENT NO. : 5,361,237
DATED : November 1, 1994
INVENTOR(S) : Chishiki

It is certified that error appears in the above-indentified patent and that said Letters Patent is hereby corrected as shown below:

Col. 3, line 11, delete "VN2"

Col. 3, line 12, delete "(VN2')" insert --VN2(VN2')--

Col. 3, line 15, delete "$V\phi_2$" insert --$V\phi_a$--

Col. 3, line 17, delete "$V\phi_2$" insert --$V\phi_a$--

Signed and Sealed this

Twenty-eight Day of February, 1995

Attest:

BRUCE LEHMAN

Attesting Officer     Commissioner of Patents and Trademarks